US009365947B2

(12) United States Patent
Uzoh et al.

(10) Patent No.: US 9,365,947 B2
(45) Date of Patent: Jun. 14, 2016

(54) METHOD FOR PREPARING LOW COST SUBSTRATES

(71) Applicant: Invensas Corporation, San Jose, CA (US)

(72) Inventors: Cyprian Emeka Uzoh, San Jose, CA (US); Sitaram Arkalgud, Cupertino, CA (US)

(73) Assignee: Invensas Corporation, San Jose, CA (US)

( * ) Notice: Subject to any disclaimer, the term of this patent is extended or adjusted under 35 U.S.C. 154(b) by 153 days.

(21) Appl. No.: 14/046,443

(22) Filed: Oct. 4, 2013

(65) Prior Publication Data

US 2015/0096790 A1 Apr. 9, 2015

(51) Int. Cl.
*C25F 3/14* (2006.01)
*C25F 3/12* (2006.01)
*H05K 1/02* (2006.01)
*H05K 1/11* (2006.01)
*H01L 23/498* (2006.01)
*H01L 21/48* (2006.01)

(52) U.S. Cl.
CPC ... *C25F 3/12* (2013.01); *C25F 3/14* (2013.01); *H01L 21/486* (2013.01); *H01L 23/49827* (2013.01); *H05K 1/0212* (2013.01); *H05K 1/115* (2013.01); *H01L 2224/16225* (2013.01); *H01L 2924/15311* (2013.01)

(58) Field of Classification Search
CPC .................. C25F 3/02; C25F 3/04; C25F 3/14
See application file for complete search history.

(56) References Cited

U.S. PATENT DOCUMENTS

| 3,319,317 A | 5/1967 | Roche et al. |
| 3,488,429 A | 1/1970 | Boucher |
| 3,605,260 A | 9/1971 | Spridco et al. |
| 3,801,388 A | 4/1974 | Akiyama et al. |
| 4,190,474 A | 2/1980 | Berdan et al. |
| 4,404,059 A | 9/1983 | Livshits et al. |
| 4,642,160 A | 2/1987 | Burgess |

(Continued)

FOREIGN PATENT DOCUMENTS

| CN | 1202794 A | 12/1998 |
| DE | 19515159 A1 | 11/1995 |

(Continued)

OTHER PUBLICATIONS

International Partial Search Report for Application No. PCT/US2014/058392 dated Dec. 9, 2014.

(Continued)

*Primary Examiner* — Nicholas A Smith
(74) *Attorney, Agent, or Firm* — Lerner, David, Littenberg, Krumholz & Mentlik, LLP

(57) ABSTRACT

A mask is formed over a first conductive portion of a conductive layer to expose a second conductive portion of the conductive layer. An electrolytic process is performed to remove conductive material from a first region and a second region of the second conductive portion. The second region is aligned with the mask relative to an electric field applied by the electrolytic process. The second region separates the first region of the second conductive portion from the first conductive portion. The electrolytic process is concentrated relative to the second region such that removal occurs at a relatively higher rate in the second region than in the first region.

16 Claims, 7 Drawing Sheets

(56) References Cited

U.S. PATENT DOCUMENTS

| | | | |
|---|---|---|---|
| 4,655,516 A | 4/1987 | Shaffer et al. |
| 4,991,285 A | 2/1991 | Shaheen et al. |
| 5,071,359 A | 12/1991 | Arnio et al. |
| 5,092,036 A | 3/1992 | Hu et al. |
| 5,108,541 A | 4/1992 | Schneider et al. |
| 5,153,987 A | 10/1992 | Takahashi et al. |
| 5,177,863 A | 1/1993 | Lam |
| 5,334,487 A | 8/1994 | Kindl et al. |
| 5,334,804 A | 8/1994 | Love et al. |
| 5,338,900 A | 8/1994 | Schneider et al. |
| 5,354,593 A | 10/1994 | Grandmont et al. |
| 5,426,850 A | 6/1995 | Fukutomi et al. |
| 5,457,881 A | 10/1995 | Schmidt et al. |
| 5,464,662 A | 11/1995 | Murakami et al. |
| 5,509,553 A | 4/1996 | Hunter, Jr. et al. |
| 5,531,021 A | 7/1996 | Kolman et al. |
| 5,595,858 A | 1/1997 | Akama et al. |
| 5,600,103 A | 2/1997 | Odaira et al. |
| 5,637,834 A | 6/1997 | La Bate, Jr. et al. |
| 5,650,595 A | 7/1997 | Bentlage et al. |
| 5,744,285 A | 4/1998 | Felten et al. |
| 5,774,340 A | 6/1998 | Chang et al. |
| 5,822,850 A | 10/1998 | Odaira et al. |
| 5,948,533 A | 9/1999 | Gallagher et al. |
| 5,950,306 A | 9/1999 | Suzuki et al. |
| 6,133,072 A | 10/2000 | Fjelstad |
| 6,177,636 B1 | 1/2001 | Fjelstad |
| 6,237,218 B1 | 5/2001 | Ogawa et al. |
| 6,255,039 B1 | 7/2001 | Xu et al. |
| 6,262,376 B1 | 7/2001 | Hurwitz et al. |
| 6,262,478 B1 | 7/2001 | Hurwitz et al. |
| 6,280,640 B1 | 8/2001 | Hurwitz et al. |
| 6,310,391 B1 | 10/2001 | Nagasawa et al. |
| 6,372,620 B1 | 4/2002 | Oosawa et al. |
| 6,381,837 B1 | 5/2002 | Baker et al. |
| 6,386,890 B1 | 5/2002 | Bhatt et al. |
| 6,448,510 B1 | 9/2002 | Neftin et al. |
| 6,473,963 B1 | 11/2002 | Goenka et al. |
| 6,528,874 B1 | 3/2003 | Iijimal |
| 6,617,236 B2 | 9/2003 | Oosawa et al. |
| 6,646,337 B2 | 11/2003 | Iijima et al. |
| 6,695,623 B2 | 2/2004 | Brodsky et al. |
| 6,747,216 B2 | 6/2004 | Brist et al. |
| 6,779,262 B1 | 8/2004 | Gales et al. |
| 6,782,610 B1 | 8/2004 | Iijima et al. |
| 6,828,221 B2 | 12/2004 | Iijima et al. |
| 6,884,709 B2 | 4/2005 | Iijima et al. |
| 7,096,578 B2 | 8/2006 | Iijima et al. |
| 7,176,382 B2 | 2/2007 | Shi et al. |
| 7,257,891 B2 | 8/2007 | Lee et al. |
| 7,262,368 B2 | 8/2007 | Haba et al. |
| 7,297,562 B1 | 11/2007 | Huemoeller et al. |
| 2004/0004006 A1* | 1/2004 | Taylor ............... B23H 3/00 205/659 |
| 2004/0201096 A1 | 10/2004 | Iijima et al. |
| 2005/0000729 A1 | 1/2005 | Iljima et al. |
| 2006/0207889 A1 | 9/2006 | Staud |
| 2007/0075717 A1 | 4/2007 | Kinghorn et al. |
| 2013/0233609 A1 | 9/2013 | Kummerl |

FOREIGN PATENT DOCUMENTS

| | | |
|---|---|---|
| EP | 0457501 A2 | 11/1991 |
| EP | 0593966 A1 | 4/1994 |
| EP | 0805614 A1 | 11/1997 |
| GB | 1126370 A | 9/1968 |
| JP | 52012458 | 1/1977 |
| JP | 03270193 | 12/1991 |
| JP | 05048242 | 2/1993 |
| JP | 05198946 | 8/1993 |
| JP | 06177514 | 6/1994 |
| JP | 06326438 | 11/1994 |
| JP | 07099384 | 4/1995 |
| JP | 09023067 | 1/1997 |
| JP | 10051136 | 2/1998 |
| JP | 11087912 | 3/1999 |
| JP | 11087932 | 3/1999 |
| JP | 11163207 | 6/1999 |
| JP | 11-261225 | 9/1999 |
| JP | 11251365 | 9/1999 |
| WO | 9810121 A1 | 3/1998 |

OTHER PUBLICATIONS

International Search Report and Written Opinion for Application No. PCT/US2014/058392 dated Mar. 3, 2015.

* cited by examiner

METHOD FOR PREPARING LOW COST SUBSTRATES

BACKGROUND OF THE INVENTION

The present invention relates to packaging of microelectronic devices, especially the packaging of semiconductor devices.

Microelectronic devices generally comprise a thin slab of a semiconductor material, such as silicon or gallium arsenide, commonly called a die or a semiconductor chip. Semiconductor chips are commonly provided as individual, prepackaged units. In some unit designs, the semiconductor chip is mounted to a substrate or chip carrier, which is in turn mounted on a circuit panel, such as a printed circuit board.

Active circuitry is fabricated in a first face of the semiconductor chip (e.g., a front surface). To facilitate electrical connection to the active circuitry, the chip is provided with bond pads on the same face. The bond pads are typically placed in a regular array either around the edges of the die or, for many memory devices, in the die center. The bond pads are generally made of a conductive metal, such as copper, or aluminum, and are around 0.5 micron (μm) thick. The bond pads could include a single layer or multiple layers of metal. The size of the bond pads will vary with the device type but will typically measure tens to hundreds of microns on a side.

An interposer can be used to provide electrical connections between microelectronic elements such as one or more unpackaged or packaged semiconductor chips with one another, or between one or more unpackaged or packaged semiconductor chips and other components such as an integrated passives on chip ("IPOC") having passive circuit elements thereon, discrete passive devices, e.g., capacitors, resistors, or inductors or a combination of the same, without limitation. An interposer can couple such chip or plurality of chips with other structure such as a circuit panel.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/O's." These I/O's must be interconnected with the I/O's of other chips. The interconnections are desirably short and desirably have low impedances to minimize signal propagation delays. The components which form the interconnections should not greatly increase the size of the assembly. Similar needs arise in other applications as, for example, in data servers such as those used in internet search engines. For example, structures which provide numerous short, low-impedance interconnects between complex chips can increase the bandwidth of the search engine and reduce its power consumption.

Despite the advances that have been made in interposer structure and fabrication, further improvements can be made to enhance the processes for making interposers and the structures which can result from such processes.

BRIEF SUMMARY OF THE INVENTION

In accordance with an aspect, a method of making or processing a component is provided. In accordance with such aspect, a mask may be formed over a first conductive portion of a conductive layer to expose a second conductive portion of the conductive layer. An electrolytic process may be performed to remove conductive material from a first region and a second region of the second conductive portion. The second region may be aligned with the mask relative to an electric field applied by the electrolytic process. The first region of the second conductive portion may be separated from the first conductive portion by the second region of the second conductive portion. The electrolytic process may be concentrated relative to the second region of the second conductive portion such that removal occurs at a relatively higher rate in the second region than in the first region.

In some arrangements, the second region of the second conductive portion may be completely removed by the electrolytic process to electrically isolate the first conductive portion from the first region of the second conductive portion so as to form a plurality of conductive vias. In some arrangements, the first region of the second conductive portion may form a portion of a continuous commoning element surrounding each of individual formed conductive vias. In some arrangements, the continuous commoning element may be shorter than conductive vias formed adjacent to the commoning element.

In some arrangements, at least one of the conductive vias may have a height-to-width aspect ratio greater than 20:1. In some arrangements, such ratio may be in the range between 20:1 and 40:1, and in some arrangements, in the range between 30:1 and 40:1.

In some arrangements, an insulating layer may be formed between the first conductive portion and the first region of the second conductive portion to form at least a portion of an interposer.

In some arrangements, at least a surface of the second conductive portion may be configured to serve as at least one of a mechanical support, a thermal conductor, and an electrical ground.

In some arrangements, the first conductive portion may be configured as at least a portion of a conductive via. In some arrangements, upon formation of the interposer, the conductive via may extend from a first side of the interposer to a second side of the interposer. In some arrangements, the second conductive portion may be configured to provide at least one of a heat and an electrical ground path function for components coupled to the interposer.

In some arrangements, a barrier layer may be formed prior to forming the insulating layer. The barrier layer may provide at least one of heat insulation and electrical conductivity.

In some arrangements, at least a portion of the insulating layer may be planarized to expose top surfaces of at least some of the vias such that at least the planarized portion of the insulating layer and the top surfaces of the vias form a flat surface.

In some arrangements, at least a first wiring layer may be formed to extend in at least one direction parallel to a major surface of the component being processed. The wiring layer may be electrically coupled with at least some of the exposed vias. In some arrangements, the first wiring layer may be formed at a first surface of the insulating layer opposite a second surface of the insulating layer.

In some arrangements, a contacting side of the conductive layer may be removed from the support. In some arrangements, a second wiring layer may be formed at the second surface of the insulating layer.

In some arrangements, posts may be formed at the first wiring layer, the posts being electrically coupled with at least some of the formed vias. In some arrangements, the posts may be attached to a support. In some arrangements, the posts may be attached to the support prior to the electrolytic removal of the metal from the substrate. In some arrangements, a plurality of electrolytically resistant masks may be applied at a side of the substrate opposite the posts. In some arrangements, the masks may prevent the electrolytic removal of metal except within a plurality of regions between edges of adjacent masks.

In some arrangements, the support may include a photo-decomposable adhesive or adhesive layer and a carrier. In some arrangements, the adhesive or adhesive layer may be transparent or translucent such that light passing through the carrier decomposes the photo-decomposable adhesive.

In some arrangements, the formed vias may have a height-to-width aspect ratio in the range between 30:1 and 40:1. In some arrangements, such ratio may be in the range between 30:1 and 40:1.

In some arrangements, the performance of the electrolytic process may include agitating an electrolytic bath. In some arrangements, the performance of the electrolytic process may include alternating between an electrolytic material removal process and an electrolytic plating process. In some arrangements, a duty cycle of such alteration may be determined based on an amount of material desired to be removed. In some arrangements, the electrolytic removal process may be either or both for a relatively longer duration and at a relatively higher current density than the electrolytic plating process. In some arrangements, a duty cycle of either or both of such duration and such current density may be determined based on an amount of material desired to be removed.

In some arrangements, the electrolytic bath may include a complexing agent. In some arrangements, increasing the concentration of the complexing agent may reduce the mobility of ions in the electrolytic bath.

In some arrangements, the electrolytic bath may include a passivating agent selected to concentrate the electrolytic removal process to the region aligned with the mask relative to the electric field.

In some arrangements, the conductive layer may be a metallic substrate.

In some arrangements, a contacting side of the conductive layer may be supported by a support during the electrolytic process and the electrolytic process may occur in an electrolytic solution. In some such arrangements, the electrolytic process may be continued until the support is exposed to the electrolytic solution. In some such arrangements, the continuing of the electrolytic process may complete vias.

In some arrangements, the conductive layer may be adhered to the support with a photo-decomposable adhesive. In some arrangements, the support may be transparent or translucent such that the photo-decomposable adhesive may be subject to decomposition by light passing through the support.

In some arrangements, during the electrolytic process, at least one gap may be defined by remaining material within the second region of the second conductive portion of the conductive layer. In such arrangements, the one or more gaps may be between the first conductive portion and the second region of the second conductive portion.

In some arrangements, the distance between a contacting surface of the mask contacting the conductive layer and a nadir of at least one of the one or more gaps may be three or more times greater than the distance between the contacting surface of the mask and an apex of the first region of the second conductive portion. In some arrangements, the distance between a contacting surface of the mask contacting the conductive layer and a nadir of at least one of the one or more gaps may less than or equal to 1.5 times greater than the distance between the contacting surface of the mask and the apex of the first region of the second conductive portion.

In some arrangements, the conductive layer may overlie a support structure. In some such arrangements, the electrolytic process may continue to be performed until the support structure is exposed. In some such arrangements, the continuing of the performance of the electrolytic process may form complete conductive vias. In some arrangements, an insulating layer may be formed over at least portions of the continuous commoning element and the complete vias adjacent to such portions.

In some arrangements, the removal of the conductive material may occur isotropically, anisotropically, or both isotropically and anisotropically. In such arrangements, the rates of removal of the conductive material of the conductive layer may be isotropic, anisotropic, or both isotropic and anisotropic, respectively, in different regions within the electrolytic bath.

In some arrangements, the masks may prevent the removal of the conductive material through the electrolytic process from the first region.

In accordance with an aspect, a method of making or processing a component is provided. In accordance with such aspect, portions of a conductive layer may be removed electrolytically through a plurality of masks applied to the substrate. The electrolytic removal may form portions of vias. The portions of vias may form portions of an interposer. A first side of the conductive layer may overlie a first wiring layer such that the portions of the conductive layer may be removed from a second side of the conductive layer opposite the wiring layer. A first insulating layer may be formed to electrically insulate individual vias such that a first subassembly is formed.

In some arrangements, a second wiring layer may be formed over formed first conductive posts. The formed first conductive posts may be separated from each other by a second insulating layer to form a second subassembly. In some arrangements, the second subassembly may be attached to the first subassembly. In some arrangements, the second wiring layer may be electrically coupled with the first wiring layer.

In some arrangements, the first subassembly may include a third wiring layer over the formed vias and the first insulating layer. In some arrangements, the second subassembly may be attached to the third wiring layer.

In some arrangements, the second conductive posts may extend from the first wiring layer. In some arrangements, the third wiring layer may be electrically coupled with the second conductive posts.

In accordance with an aspect, an interposer is provided. The interposer may be formed by any of the methods described previously herein. For example, in forming such an interposer, a mask may be formed over a first conductive portion of a conductive layer to expose a second conductive portion of the conductive layer. An electrolytic process may be performed to remove conductive material from a first region and a second region of the second conductive portion. The second region may be aligned with the mask relative to an electric field applied by the electrolytic process. The first region of the second conductive portion may be separated from the first conductive portion by the second region of the second conductive portion. The electrolytic process may be concentrated relative to the second region of the second conductive portion such that removal occurs at a relatively higher rate in the second region than in the first region.

In some arrangements, an insulating layer may be formed between the first conductive portion and the first region of the second conductive portion. In some arrangements, such an interposer may include at least one via, which may be conductive, that may have a height-to-width aspect ratio greater than 20:1. In some arrangements, such ratio may be in the range between 20:1 and 40:1, and in some arrangements, in the range between 30:1 and 40:1.

In accordance with an aspect, an apparatus may have a first surface and a second surface opposite the first surface is provided. The apparatus may include at least two electrically conductive vias extending from the first surface to the second surface. The apparatus may further include a thermally conductive layer extending between adjacent ones of the electrically conductive vias. The apparatus may further include an electrically insulative layer that may separate the thermally conductive material from the electrically conductive vias.

In some arrangements, the thermally conductive layer and the electrically conductive vias may include a common metal. In some arrangements, the metal may be copper, nickel, aluminum, molybdenum, titanium tungsten, silver, tin, gold, or any alloy thereof.

In some arrangements, the electrically insulative layer may extend continuously between adjacent ones of the electrically conductive vias and along a side of the thermally conductive layer.

In accordance with an aspect, a system including an apparatus having a first surface and a second surface opposite the first surface may be provided. The apparatus of the system may include at least two electrically conductive vias extending from the first surface to the second surface. The apparatus may further include a thermally conductive layer extending between adjacent ones of the electrically conductive vias. The apparatus may further include an electrically insulative layer that may separate the thermally conductive material from the electrically conductive vias. In some arrangements, at least some of the conductive vias may be configured to provide a conductive path from a first microelectronic element associated with the first surface of the apparatus to a microelectronic element or plurality of microelectronic elements associated with the second surface and wherein the thermally conductive layer is configured to provide a thermal path for heat to be removed from the system.

In accordance with an aspect, a method of making or processing an interposer is provided. In accordance with such aspect, a mask may be formed over a first conductive portion of a conductive layer to expose a second conductive portion of the conductive layer. An electrolytic process may be performed to remove conductive material from a first region and a second region of the second conductive portion. The second region may be aligned with the mask relative to an electric field applied by the electrolytic process. The first region of the second conductive portion may be separated from the first conductive portion by the second region of the second conductive portion. The second region of the second conductive portion may be completely removed by the electrolytic process to electrically isolate the first conductive portion from the first region of the second conductive portion.

In some arrangements, the electrolytic process may include agitating an electrolytic bath. In some arrangements, the electrolytic process may include alternating between an electrolytic material removal process and an electrolytic plating process. In some arrangements, the electrolytic removal process may be relatively longer and may be at a relatively higher current density than the electrolytic plating process.

In some arrangements, a complexing agent may be maintained in the electrolytic bath. In some arrangements, the complexing agent may be configured to reduce mobility of ions in the electrolytic bath.

In some arrangements, a passivating agent may be maintained in the electrolytic bath. The passivating agent may be selected to concentrate the electrolytic removal process to the second region such that removal occurs at a relatively higher rate in the second region of the second conductive portion than in the first region of the second conductive portion.

In some arrangements, an insulating material may be formed between the first conductive portion and the first region of the second conductive portion.

In some arrangements, the first conductive portion may be configured to form at least one conductive via. In some arrangements, at least a surface of the first region of the second conductive portion may serve as at least one of a mechanical support, a thermal conductor, and an electrical ground.

In some arrangements, at least one of the one or more conductive vias may extend from a first side of the interposer to a second side of the interposer. In some arrangements, the second conductive portion may be configured to provide at least one of a heat and electrical ground path function for components coupled to the interposer. In such arrangements, the interposer and the components coupled to the interposer may form an interposer structure.

DETAILED DESCRIPTION

Components described herein such as interposers, substrates, circuit panels, microelectronic elements, and the like may have either or both insulating and dielectric structure, in some arrangements, at external surfaces thereof. Accordingly, as used in this disclosure, a statement that an electrically conductive element is "at" a surface of dielectric structure of a component, indicates that, when the component is not assembled with any other element, the electrically conductive element is available for contact with a theoretical point moving in a direction perpendicular to the surface of the component toward the surface of the component from outside the component. Thus, a terminal or other conductive element which is at a surface of a component may project from such surface; may be flush with such surface; or may be recessed relative to such surface in a hole or depression in the component.

Figure 1:
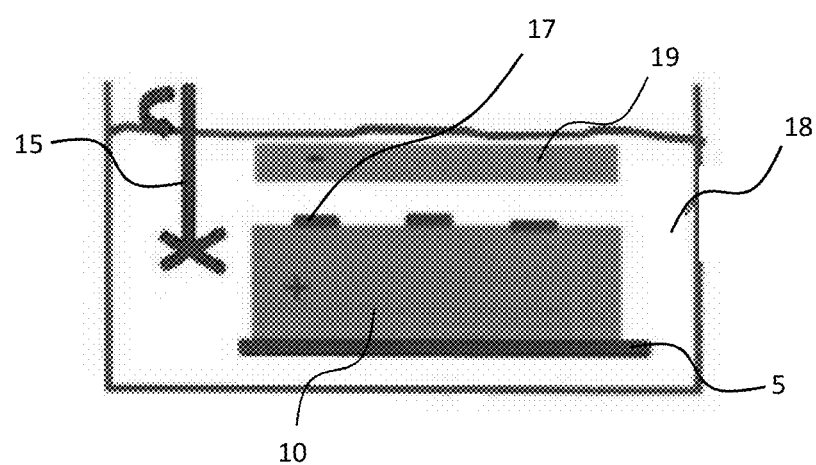
FIG. 1 is a schematic of a conductive layer within an electrolytic bath just prior to electrolytic processing of the conductive layer in accordance with an embodiment.

Referring now to the drawings, as shown in FIG. 1, a conductive layer 10 may be attached with or on a support 5. In one example, the support 5 may include one or more polymeric materials. In one example, the conductive layer may be a unitary element, of metal, for example. In some arrangements, the conductive layer may be a layer of a substrate that includes multiple layers of conducting and insulating layers. In some arrangements, such conducting and insulating layers may be patterned. In some arrangements, the support may include a single layer or multiple layers, which may be made of the same or different materials. In some arrangements, the conductive layer 10 may be made of materials such as, but not limited to, copper, nickel, tungsten, aluminum, titanium, gold or their various alloys, and electrically conductive oxides of such metals. In some arrangements, the conductive layer 10 may be a metallic foil.

A mask layer 17, such as a resist film layer, which may be chemically-resistant, may be applied along a surface of the conductive layer 10 opposite the support 5. In some arrangements, the mask layer 17 may be made of materials such as, but not limited to, oxides, nitrides, epoxides, or acrylics. In some arrangements, the mask layer 17 may be a conductive material. In a preferred arrangement, the mask layer 17 may be electrically conductive such that it may have a rate of removal substantially lower than the rate of removal of the conductive layer 10 during an electrolytic processing operation. In such arrangements, the mask layer 17 may include materials such that the byproducts of the removal of the mask layer 17 do not degrade the performance of an electrolyte during the electrolytic processing operation.

As further shown, an assembly of the support 5, the conductive layer 10, and the mask layer 17 may be immersed in an electrolytic bath 18. A conductive substrate 19 may also be immersed in the electrolytic bath 18 at a position overlying the mask layer 17. In this manner, the conductive layer 10 may serve as an anode and the conductive substrate 19 may serve as a corresponding cathode within the electrolytic bath 18. In some arrangements, the conductive substrate 19 may be made of materials such as but not limited to stainless steel, titanium, tantalum, nickel, carbon, platinum coated conductor or surface, gold coated surface or metallic alloys.

The electrolytic bath 18 is the medium for electrochemically removing conductive material from the conductive layer 10. During the material removal step, the conductive substrate 10 is rendered anodic while the substrate 19 is rendered cathodic. Depending on the choice of the cathode 19 material, the removed material from anode 10 may be coated on the cathode 19 or gases may evolve at the surface of the cathode. In some arrangements, the electrolytic removal of materials from the anodic substrate 10 may be isotropic. In some arrangements, the electrolytic removal rate may be anisotropic and in some other arrangements, may be both isotropic and anisotropic.

The electrolytic bath 18 may include an electrolyte that may be acidic, neutral, or alkaline. The electrolyte may be aqueous or non-aqueous, and in some arrangements may be colloidal in nature. The electrolyte may be may be protic or aprotic. For example, for an aqueous formulation, various components in the electrolyte may be added to water and for a non-aqueous formulation, the various components may be added to dimethylformamide. In some such arrangements, the electrolytic bath 18 may include one or more passivating agents and one or more complexing agents. Such a passivating agent may be, but is not limited to being, benzotriazole, 2-mercatobenzimidazole, 5-methyl-1-H-benzotriazole, methiamazole or humic acid. The nature of the passivating agent and its concentration in combination with other additives may be selected to concentrate the electrolytic removal process to regions aligned with edges of portions of the mask layer 17 in the direction of an electric field produced by and between the anodic conductive layer 10 and the cathodic substrate 19. The concentration of the passivating agent may range between 0.01 and 30000 parts per million (ppm) and preferably between 1 and 300 ppm.

In some arrangements, the electrolytic bath 18 may include complexing agents that may be used to control the conductivity of the electrolyte and that may form a complex with materials dissolved from either of the anodic conductive layer 10 and the cathodic conductive substrate 19 during the material removal process. Such complexing agents may be, but are not limited to being, citric acid, sodium citrate or other citrates, sodium gluconate or other gluconates, phytic acid and phytic acid salts, diamines and triamines for example ethylene diamine, diethylenetriamines, ethylene diamine tetraacetic acids and salts thereof or salts of pyrophosphates. The concentration of the complexing agent may range between 0.01 and 2.5M and preferably between 0.05 and 1.0M.

Also, neutral salt and non-neutral salt or salts, such as sodium sulfate, potassium sulfate, copper sulfate, nickel sulfate or sulfamate may be added to the bath as additional agents to control the conductivity of the electrolyte in the electrolytic bath 18. The concentration of such salts may range between 0.002 and 2.0M. The higher the salt concentration, the higher the electrical conductivity of the bath 18. The pH of the electrolyte may vary from 1 to 11 and may be controlled by adding basic and acidic compounds. For example, the basic compound may be sodium hydroxide and the acidic compound may be sulfuric acid. Also, known buffering agents may be added to the bath 18 to stabilize the pH of the electrolyte. Other processing aids, such as surfactants may be added to the bath 18 to improve the dispersion and to reduce the incidence of attachment of gases to the layer 10 during processing operations. The surfactant may be cationic, anionic or non-ionic. In some arrangements, the surfactant preferably may be ono-ionic. The concentration of the surfactant may vary between 2 and 10000 ppm and preferably between 20 and 500 ppm.

As further depicted in FIG. 1, the electrolytic bath 18 may be agitated to facilitate either or both of the electrolytic removal or plating processes. In some arrangements, layer 10 may be rotated about an axis 15, as shown, to facilitate these processes. In one example, the speed of such rotation may vary between 2 and 60 rpm. During the material removal step, the agitation of the electrolytic bath 18 or the substrate 10 may be reduced or increased as desired.

In some arrangements, during the conductive material removal process, the electrolytic process may be alternated between the electrolytic material removal process and the electrolytic plating process. In such arrangements, the electrolytic removal process may be either or both relatively longer in duration and conducted at a relatively higher current density than the electrolytic plating process. For example, the removal process may be performed at an anodic current density between 20 and 250 mA/cm$^2$ (constant current) for 3 seconds applied to the layer 10. During this process, the current may be turned off for a time varying between 3 and 15 seconds. A cathodic current of between 0.1 and 3 mA/cm$^2$ then may be applied to the layer 10 for a time ranging from 3 to 30 seconds. Depending on the thickness of the layer 10 and the amount of material to be removed, e.g., sculpted, the anodic and the cathodic currents may be applied in one or more cycles, which can vary between 1 and 500 or even more cycles. In some arrangements, the material removal process may be performed under potentiostatic conditions (constant voltage) in which the voltage profiles may be similar to the current profiles aforementioned.

Figure 2:
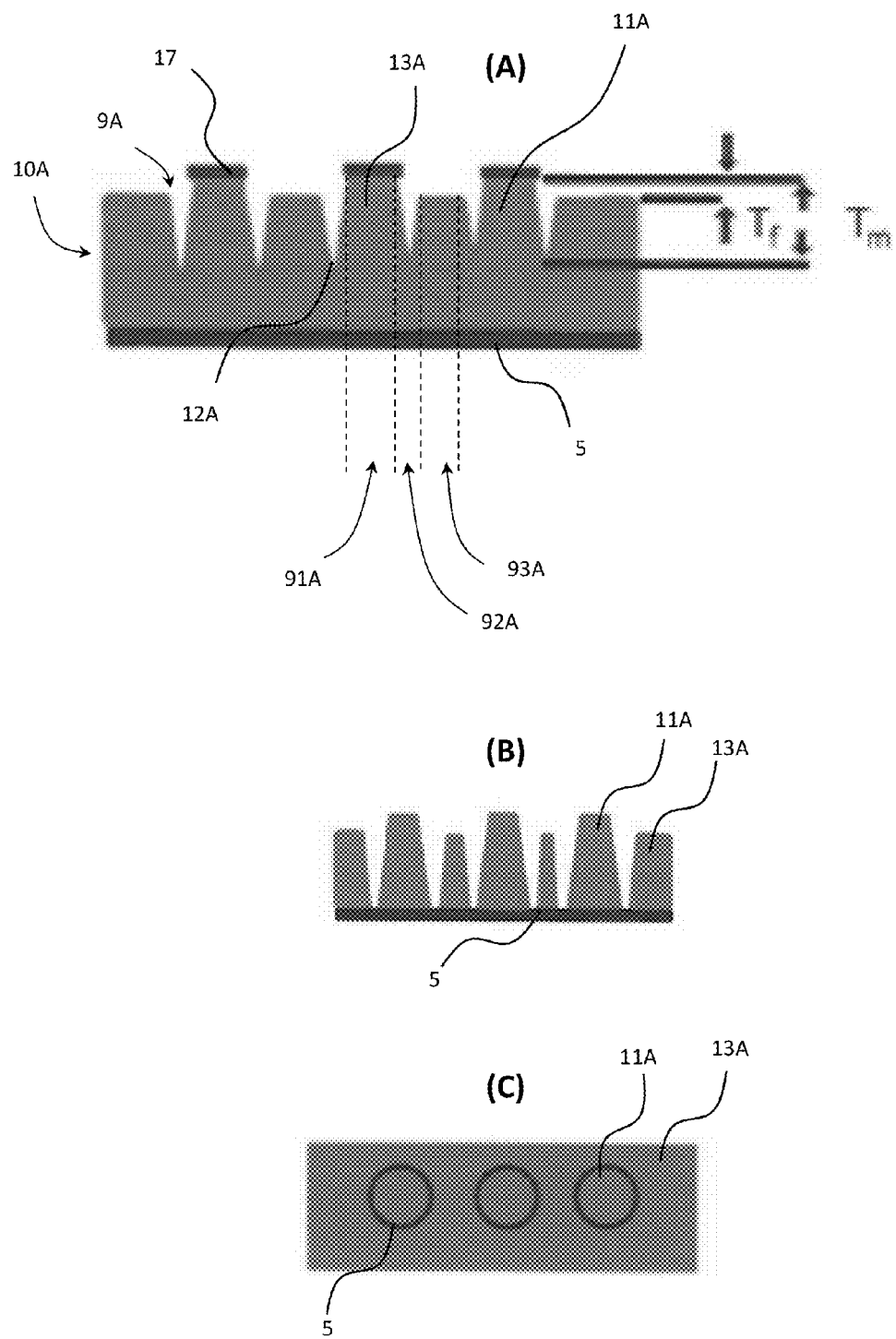
FIGS. 2A-C and 3A-C are cross-sectional elevation views of respective conductive layers formed by the process shown in FIG. 1 during various stages of electrolytic processing of such conductive layers.

Referring to FIGS. 2A-C, in electro-sculpting of Type I as used herein, the electrolytic reaction between the layer 10 and the substrate 19 may cause gaps 9A around the mask layer 17 to be formed in the conductive layer 10, now denoted as the in-process conductive layer 10A. Such gaps 9A may be formed around a first conductive portion 91A of the conductive layer 10A and may be defined by a second region 92A of a second conductive portion adjacent to the edges of portions of the mask layer 17, as shown. Such an electrolytic process may remove material from any surfaces of the conductive layer 10A exposed to the electrolytic bath 18 (not shown). In some arrangements, the passivating agent or agents described previously herein may be relatively concentrated or may adsorb more in a first region 93A and less in the second region 92A of the second conductive portion during the electrolytic process such that material may be removed from the conductive layer 10A more rapidly at locations along the surface of the layer 10A in the second region 92A of the second conductive portion.

In some arrangements, material or materials from the bath 18 may adsorb more preferentially on the vertical or near vertical wall of the layer 10A beneath the mask layer 17 to suppress the removal of the material 10A under the resist 17, thus reducing an undercut etch profile of the layer 10A. The interaction between the mask layer 17 and the selective adsorption and coating of passivating agents during the removal process may cause the electric field distribution to concentrate around the mask layer 17. This selective concentration of electric field and preferential adsorption of passivating agents enhances anisotopic etching of the layer 10A. The materials removed from the layer 10A by this process may be bounded by the complexing agent in the electrolytic bath 18 to minimize or eliminate any undesirable effect from excess soluble uncomplexed metal in the bath 18. The stronger or the more electrically resistive the adsorbed agents on the surface of 93A, the higher the removal rate at the bottom of 92A thereby increasing etching selectivity or anisotropy.

In this manner, as shown in FIGS. 2B and 2C, posts 11A may be formed within the first conductive portion 91A and a portion of the second region 92A of the second conductive portion and may be surrounded by an embedded region 13A within an opposing portion of the second region 92A of the second conductive portion and the first region 93A of the second conductive portion. As seen in FIG. 2C, the embedded region 13A may be a continuous commoning element that remains after the removal of the material from the second region 92A of the second conductive portion. In such arrangements, the lateral locations, i.e., the relative locations in directions parallel to a major surface of the substrate 5, of central longitudinal axes of the posts 11A may substantially correspond to the locations of the portions of the mask layer 17 overlying the conductive layer 10A. Although the embedded region 13A is shown to be continuous as in FIG. 2C, in some applications, the embedded region may be discontinuous.

In some arrangements, as further shown in FIG. 2A, the depth of the material removed from the second region 92A, i.e., the distance from a top of the conductive layer 10A in contact with the mask layer 17 to a nadir of the gap 9A, of the conductive layer 10A, designated as $T_m$, may be substantially greater than the depth of the material removed from the first region 93A of the second conductive portion of the conductive layer 10A, i.e., the distance from the top of the conductive layer 10A in contact with the mask layer 17 to an apex of the embedded region 13A of the conductive layer 10A, designated as $T_f$.

Figure 3:
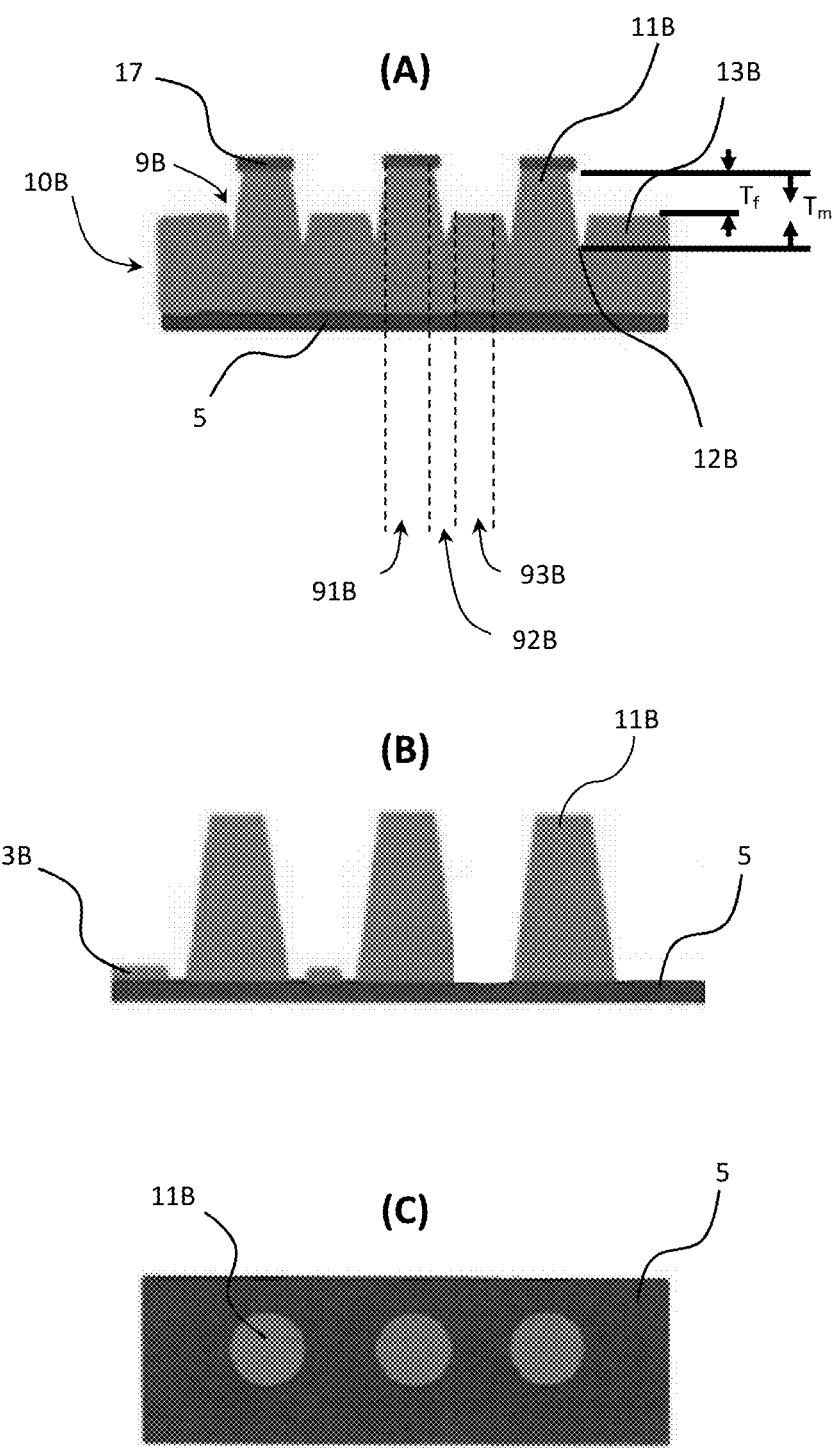

Referring now to FIG. 3, an in-process conductive layer 10B may be formed on the substrate 5 through an electrolytic process, such as that described previously herein, in which the conductive layer 10B may have posts 11B that may be formed within and that may be surrounded by an embedded region 13B. In contrast to the in-process conductive layer 10A shown in FIG. 2, either or both lowering the amount of the complexing agent or increasing the conductivity of electrolyte in the electrolytic bath 18 by adding larger amounts of conductivity agents may modify the material removal process such that an embedded region 13B of the in-process conductive layer 10B shown in FIG. 3 may have a smaller thickness, i.e., height relative to the support 5, than the corresponding embedded region 13A illustrated in FIG. 2. Thus, the electrolytic bath 18 in the example of FIG. 3 may be more conductive, and thus provide for a higher rate of material removal in the unmasked area above 93B, than the bath 18 in the example of FIG. 2. In this manner, of the depth of the material removed from the from a second region 92B of a second conductive portion, designated as $T_m$ in FIG. 3, may be substantially the same as the depth of the material removed from a first region 93B of the second conductive portion of the conductive layer 10B, designated as $T_f$ in FIG. 3. In some arrangements, as best shown in FIGS. 3B and 3C, unwanted remaining portions of the embedded region 13B may be removed in subsequent steps from the support 5 or when the support 5 may be removed or polished off. In this manner, only the posts 11B may remain on the support 5, thus forming conductive vias, as illustrated in FIG. 3C. In some arrangements, the support 5 may be may be made of a polymeric material. In some such arrangements, the support may be a polyimide sheet. In some arrangements, a bottom side of the layer 10B may be coated with a conductive material that is different from that of the layer 10B. For instance, a solderable alloy may be coated on the bottom side of the layer 10B prior to attachment of the bottom side of the layer 10B to the support 5. The same sculpting electrolytic bath 18 may be used to remove the undesirable regions of the solderable alloy or other undesirable materials. In some arrangements, another etchant may be used to remove the undesirable region disposed between the layer 10B and the support 5. In some arrangements, dissimilar materials may be coated on the bottom side as well as a top side of the layer 10B prior to the coating and processing of the mask layer 17 and before the conductive material removal step. For example, nickel or nickel alloy layer may be coated over the top surface of a copper substrate serving as the layer 10B, in which the nickel material may be coated with a solderable alloy. The alloy layer may be the coated with the mask layer 17 and patterned. Similarly, both surfaces of the layer 10B may be coated as described above prior to attachment of the layer 10B to the support 5.

In some arrangements, for example, by using a negative resist layer or inverted image with a positive resist layer (not shown), a through-hole feature may be sculpted in the layer 10, in which the through-hole feature may be surrounded by the un-etched embedded member or members.

Figure 4:
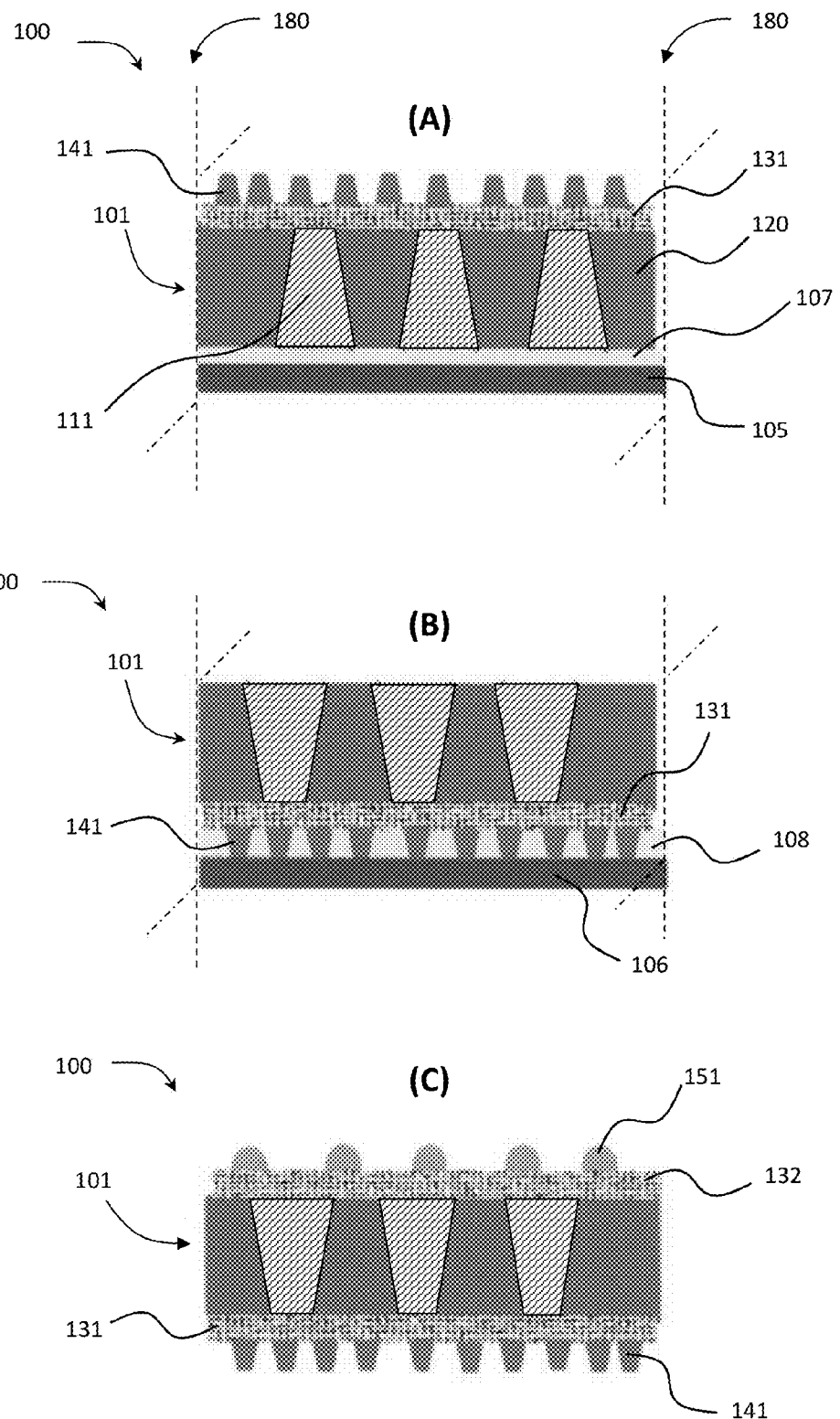
FIGS. 4A-C are cross-sectional elevation views illustrating various stages of processing an interposer in which a conductive layer is formed on a photo-decomposable adhesive applied to and removable from a substrate in accordance with an embodiment.

Referring now to FIGS. 4A-C, posts, which may be the same or substantially similar to the posts 11A or 11B, may be formed through electrolytic processing of a conductive layer, such as that described previously herein with respect to FIGS. 1-3. In this particular example, the conductive layer may be most similar to the posts 11B as there is no embedded region. An insulating layer 120 may be formed onto the posts. In some arrangements, the insulating layer 120 may be a molded encapsulation that may be formed by, but is not limited to being formed by, a silicon-based dielectric material, a potting compound, a particulate composite layer which includes a polymeric matrix and particulate loading within the polymeric matrix. Such a composite layer may be formed, for example by depositing an uncured polymeric material which has the particulate loading material therein onto the conductive layer, the particulate loading material optionally being a dielectric material having a low coefficient of thermal expansion ("CTE"). In one example, the insulating layer 120 may be a structure including a dielectric material that is laminated with the conductive layer. For example, the structure may be a build up structure which includes one or more layers of polymeric dielectric material, which may or may not include additional reinforcing structure such as either or both of glass mesh and filler material such as but not limited to any of glass, ceramic dielectric filler, and semiconductor filler. In a particular example, such a structure may include one or more layers of ceramic dielectric material. In one example, the insulating layer may include a photoimageable material such as benzocyclobutane (BCB), of which, in one example, openings corresponding to locations of the posts 11A or 11B may be formed by photolithographic patterning.

An exposed side of the insulating layer 120 and, in some instances, the posts may be planarized, such as by but not limited to being by a chemical mechanical planarization (CMP) process to form a flat surface of the insulating layer 120, as more fully described in U.S. patent application Ser. No. 13/830,279 ("the '279 application"), the disclosure of which is hereby incorporated by reference herein in its entirety. In this manner, the posts may be exposed to form vias 111 for electrical interconnection therewith. During such planarization, unwanted materials may also be removed at the surface of the insulating layer 120.

As in the example of FIG. 4A-4C, the vias 111 and the insulating layer 120 may be formed on and overlie a photo-decomposable adhesive 107 that may be applied to a transparent or translucent support 105. In this manner, when the photo-decomposable adhesive 107 is subjected to light for a period of time based on the thickness of the adhesive 107, the adhesive 107 may disintegrate, allowing the vias 111 and the insulating layer 120 to be removed from the adhesive 107 and thus to be separated from the support 105, resulting in an interconnect structure 101 including the vias 111 and the insulating layer 120 as depicted with other structure which can be provided therewith as shown in FIG. 4A.

For example, the support 105 may be transparent or translucent. The support may be made of materials such as but not limited to glass, glass-ceramic or ceramic materials. The support 105 may be coated with the adhesive 107, which may be 3M™ Light-To-Heat-Conversion (LTHC) release coating, in which the LTHC layer may be coated with 3M™ UV-Curable Adhesive LC-3200 or Adhesive LC-4200 or Adhesive LC-5200. A conductive layer, such as the conductive layers 10A and 10B, then may be attached to the adhesive 107 on the support 105 for the various processing steps. After the various processing steps, the support 105 may be separated from the adhesive 107 using a laser debonding method. The adhesive 107 may be later removed from the layers 10A and 10B after processing thereof using 3M™ De-Taping Tape 3305.

An interposer that may include the interconnect structure 101 may then be formed into a number of configurations, such as but not limited to those described in U.S. patent application Ser. No. 13/795,756 ("the '756 application") and the '279 application, the disclosures of which are hereby incorporated by reference herein in their entireties, as well as those described further herein. As shown in FIG. 4A, an in-process interposer 100 may be a portion of a panel of in-process interposers. The in-process interposer may include a redistribution structure 131, i.e., a wiring layer, that may be formed at the surface defined by the insulating layer 120 and the vias 111 of the interconnect structure 101. As further shown in FIG. 4A, one or more conductive posts or bond structures 141 may be formed or placed onto the redistribution structure 131. In this manner, the vias 111 may be electrically coupled with the posts 141.

As shown in FIG. 4B, following a separation of the interconnect structure 101 from the support 105, the in-process interposer 100 may be attached to a second support 106 such that the conductive posts 141 may lie within and adhere to an adhesive 108 and such that the redistribution structure 131 may overlie and adhere to the adhesive 108. In some arrangements, as shown, the in-process interposer 100 may be placed such that tips of the conductive posts 141 may lie flat against the substrate 106. As further shown, an exposed side of the combination of the insulating layer 120 and the vias 111 may be planarized to provide a flat surface opposite the previously planarized side of the combination.

As shown in FIG. 4C, in some arrangements, a redistribution structure 132 may be formed at the exposed side of the insulating layer 120 and the vias 111 of the interconnect structure 101. In this manner, the redistribution structures 131, 132 may be electrically coupled with each other through the vias 111. Further, the redistribution structure 132 and conductive posts 141 as well as electrically conductive peripheral components electrically connected thereto, such as but not limited to microelectronic elements, microelectronic subassemblies, and microelectronic assemblies may be electrically coupled within the interposer 100. In some arrangements, as further shown, one or more joining elements 151, which may be solder balls, may be formed on the redistribution structure 132, to allow for electrical interconnection with electrically conductive peripheral components, such as those described previously herein. In this manner, the joining elements 151 and the redistribution structure 131 may be electrically coupled with each other. Further, the joining elements 151 and the conductive posts 141 as well as electrically conductive peripheral components electrically connected thereto may be electrically coupled.

As shown by FIGS. 4A-4C, in some arrangements, the panel including the in-process interposer 100 may be severed along the saw lanes 180 to form the interposer 100 shown in FIG. 4C, which may be a completed interposer. In this example, the conductive posts 141 and the joining elements 151 may be formed or placed onto the respective redistribution structures 131, 132 either before or after the severing of the in-process interposer 100.

Figure 5:
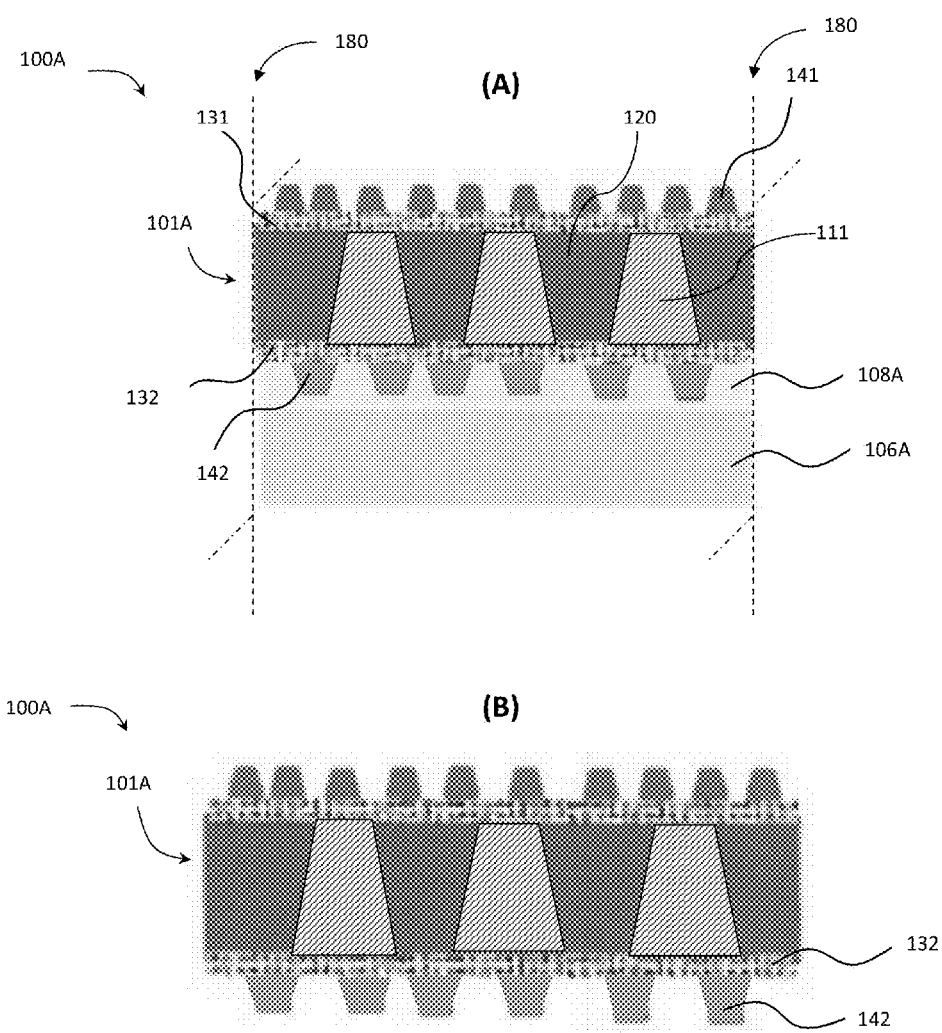
FIGS. 5A-B are cross-sectional elevation views illustrating various stages of processing an interposer in which a conductive layer is formed onto a redistribution structure overlying posts formed onto a photo-decomposable adhesive applied to and removable from a substrate in accordance with an embodiment.

Referring to FIG. 5A, an in-process interposer 100A may include an interconnect structure 101A that may be formed in the same manner as the interconnect structure 101 with the exception that the conductive layer 111 and the insulating layer 120 may be formed using a redistribution structure 132 as a support. As shown, conductive posts 142 may extend from the redistribution structure 132. The in-process interposer 100A may be attached to a support 106A such that the conductive posts 142 may lie within and adhere to an adhesive 108A and such that the redistribution structure 132 may overlie and adhere to the adhesive 108A. In some arrangements, as shown, the in-process interposer 100A may be placed such that tips of the conductive posts 142 may lie flat against the support 106A. As in the example of FIG. 5A, in some arrangements, the exposed side of the combination of the insulating layer 120 and the vias 111 of the interconnect structure 101A may be planarized to provide a flat surface opposite the previously planarized side of the combination.

As shown in FIG. 5B, in some arrangements, a redistribution structure 131 may be formed at the exposed side of the insulating layer 120 and the vias 111 of the interconnect structure 101A. In this manner, the redistribution structures 131, 132 may be electrically coupled with each other through the vias 111. Further, the redistribution structure 131 and the conductive posts 142 as well as electrically conductive peripheral components electrically connected thereto, such as but not limited to microelectronic elements, microelectronic subassemblies, and microelectronic assemblies may be electrically coupled within the interposer 100A. In some arrangements, as further shown, one or more conductive posts or bond structures 141 may be formed on the redistribution structure 131, to allow for electrical interconnection with electrically conductive peripheral components, such as those described previously herein. In this manner, the conductive posts 141 and the redistribution structure 132 may be electrically coupled with each other. Further, the conductive posts 141 and the conductive posts 142 as well as electrically conductive peripheral components electrically connected thereto may be electrically coupled. In some arrangements, as shown by the example of FIGS. 5A and 5B, the photo-decomposable adhesive 108A is subjected to light for a period of time based on the thickness of the adhesive 108A, the adhesive 108A may disintegrate, allowing the redistribution structure 132 and the conductive posts 142 to be removed from the adhesive 108A and thus to be separated from the support 106A. In some arrangements, the adhesive 108A may be 3M™ UV-Curable adhesive, and the in-process interposer 100A may be separated from the support 106A by means of laser debonding.

As shown by FIGS. 5A and 5B, in some arrangements, the interposer 100A may be a portion of a panel of in-process interposers in which the panel may be severed along the saw lanes 180 shown in FIG. 5A to form the interposer 100A shown in FIG. 5B, which may be a completed interposer. In this example, the conductive posts 142 may be formed or placed onto the redistribution structure 132 either before or after the severing of the in-process interposer 100A. In other arrangements, the conductive posts 141 may be formed or placed on the redistribution structure 131 either before or after (not shown) the severing of a panel of in-process interposers to form the interposer 100A.

Figure 6:
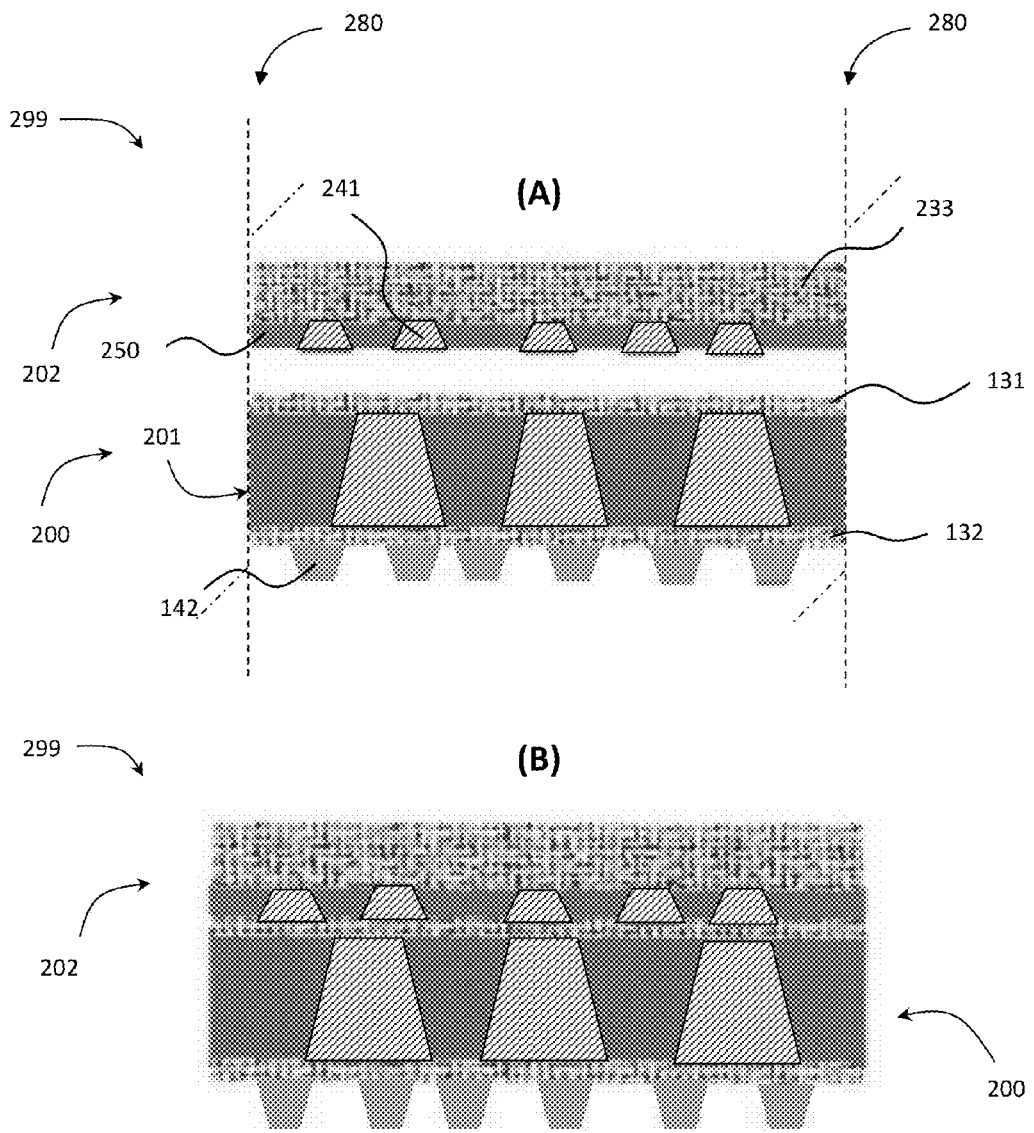
FIGS. 6A-B are cross-sectional elevation views illustrating processing of an interposer to add a conductive layer subjected to back end of line processing in accordance with an embodiment.

Referring to FIGS. 6A and 6B, a microelectronic unit 299 may be formed by assembly of an in-process interposer 200 with a microelectronic subassembly 202. The microelectronic subassembly 202 may include a plurality of conductive elements 241, which may be posts or vias, that may extend through a insulating layer 250, which may be may a thin silicon layer or other dielectric layer. The combination of the conductive elements 241 and the insulating layer 250 may be subjected to back end of line ("BEOL") processing to form a stack of interconnect layers that may form a portion of the microelectronic subassembly 202.

The in-process interposer 200 that may be the same or substantially similar to the completed interposer 100A shown in FIG. 5B, excluding the conductive posts 141, may be aligned with the microelectronic subassembly 202. The interposer 200 may include the redistribution structure 131 that may be formed onto an interconnect structure 201 and upon which the microelectronic assembly 202 may be placed. In this manner, the conductive elements 241 may be electrically coupled with the redistribution structure 131 and may be further electrically coupled with the conductive posts 142. Further in this manner, the conductive posts 142 may be electrically coupled with the interconnect layers of the microelectronic subassembly 202 formed during the BEOL as best shown in FIG. 6B.

As shown by FIGS. 6A and 6B, in some arrangements, either or both of the interposer 200 and the microelectronic subassembly 202 may be a portion of a panel of in-process interposers in which the panel may be severed along the saw lanes 280 shown in FIG. 6A to form the interposer 200 and the microelectronic subassembly 202 shown in FIG. 6B. In some arrangements, the interposer 200 and the microelectronic subassembly 202 may be severed prior to or after assembly thereof. In some arrangements, the conductive posts 142 may be formed or placed onto the redistribution structure 132 either before or after (not shown) the severing of the interposer 200.

Figure 7:
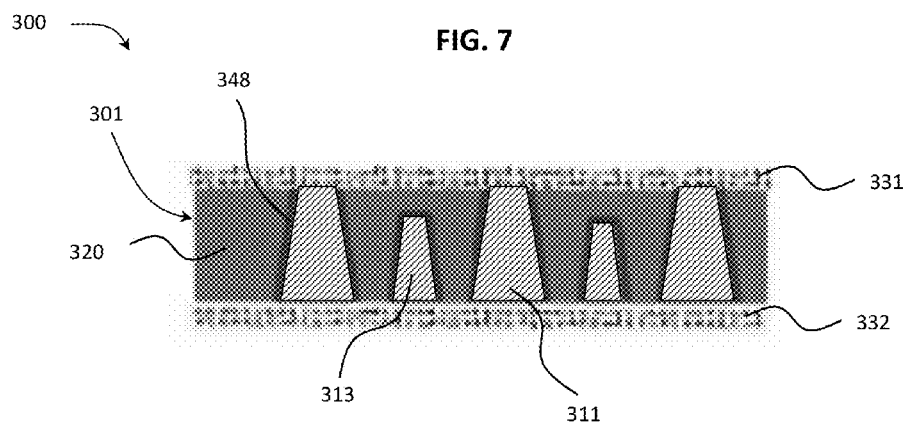
FIG. 7 is a cross-sectional elevation view of an interposer having a barrier layer between a conductive layer and a dielectric encapsulation in accordance with an embodiment.

Referring now to FIG. 7, in an alternative embodiment, an interposer 300 may include an interconnect structure 301 that may be the same or substantially similar to the interconnect structures 101 and 101A illustrated in FIGS. 4C and 5C, respectively, with the notable exception that the interconnect structure 301 may further include an insulative coating 348 and a conductive layer 311, 313 having an embedded region 313. As shown, during processing of the interconnect structure 301, a conductive layer, such as the conductive layer 10 shown in FIG. 1, may be processed in the manner illustrated and described with respect to FIGS. 2A-C, such that conductive posts 311 may be formed within the embedded region 313. In the arrangement shown, the insulative coating 348, which may be a conformal coating, may be applied to the processed conductive layer, i.e., the conductive posts and the embedded region 313. In some arrangements, the insulative coating 348 may be a dielectric coating. Such a coating may be made but is not limited to being made of silicon carbide, silicon nitride, polyimide. The insulative coating 348 preferably may have a thickness in the range between 0.1 and 5 μm, and more preferably in the range 0.2 μm and 2 μm. In some arrangements, the insulative coating 348 may be applied such that it may conform to the shape of and may fully coat the underlying conductive layer.

In some alternative arrangements, the insulative coating 348 may be applied only onto the conductive posts 311, in which a conducting matrix 320 then may be applied onto the insulative coating 348. In some arrangements, the conducting matrix 320 may be made of, but is not limited to being made of, a polyimide mold matrix. The molded or coated interconnect structure 301 may then be processed to expose the surfaces of the conductor layer 311 while not exposing the surfaces of the embedded region 313, as further shown in FIG. 7.

In some arrangements, the conducting matrix 320 may contain heat conductive particles or particulates of flakes. In some such arrangements, the particles or flakes, may be made but are not limited to being made of carbon or other polymer having good heat conducting or dispersing properties, aluminum, or other metallic particles or flakes having good heat conducting or dispersing properties. The conducting matrix 320 and the conductive layer 311 preferably may have a thickness in the range between 10 and 500 μm, and more preferably in the range between 10 and 200 μm. Through the use of the insulative coating 348, such a structure provides good heat conductivity while electrically insulating the conducting matrix 320 from the conductive layer 311, 313.

In this manner, the interconnect structure 301, may have oppositely-facing major surfaces. In some such arrangements, a first redistribution structure 331 may overlie one of the major surfaces, and a second redistribution structure 332 may overlie the other of the major surfaces, as further described more fully in the '756 application. In some arrangements, a first set of joining elements (not shown), such as but not limited to conductive posts, solder balls, and other forms of electrical contacts or conduits, may be provided, e.g., formed on or attached to the first redistribution structure 331 at predetermined positions for interconnection with other components, such the components described previously herein. Furthermore, in some arrangements, a second set of joining elements (not shown) may be provided onto the second redistribution structure 332 at predetermined positions for interconnection with still other components, as described in further examples herein and more fully in the '756 application. Accordingly, through the interposer 300, components electrically coupled with the first redistribution structure 331 may be electrically coupled with the components electrically coupled with the second redistribution structure 332.

Figure 8:
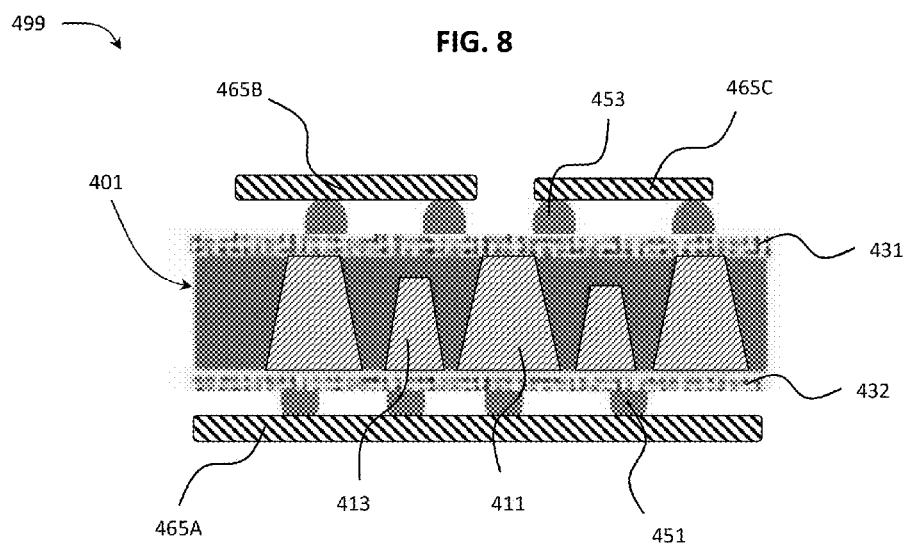
FIG. 8 is a cross-sectional elevation view illustrating processing of an interposer to add interconnections with microelectronic elements in accordance with an embodiment.

In some arrangements, any of the embodiments of interposers discussed previously herein may be either or both electrically and physically connected to other components, such as but not limited to microelectronic elements, microelectronic subassemblies, circuit panels, and the like including those described in the '756 application. For example, as shown in the example of FIG. 8, an assembly 499 may include an interconnect structure 401 having conductive vias 411 that may be surrounded by an embedded region 413, with vias 411 extending between first and second redistribution structures 432. The embedded region 413 may be a continuous electrical commoning element as seen for example in FIGS. 2A-2C. As shown, joining elements 451, which may be, but are not limited to being, solder balls, may then be formed or attached at the redistribution distribution structures 432. Bumps or other electrically conductive elements 453, e.g., pads, can be present at a face of a redistribution structure 331 on a side of the interconnect structure 401 opposite the redistribution structure 432.

A component 465A such as a circuit panel or first microelectronic element may be attached to and may be electrically coupled with the second redistribution structure 432 by the joining elements 451. Similarly, first and second microelectronic elements 465B, 465C, respectively, may be attached to and may be electrically coupled with the first redistribution structure 431 through elements 453. In this manner, the component 465A may be electrically coupled with both of the first and second microelectronic elements 465B, 465C, and microelectronic elements 465B, 465C can be electrically coupled with one another. The assembly 499 may be molded to embed the entire apparatus.

Although the interposers 100, 100A, 200, 300, the microelectronic unit 299, and the assembly 499 are discussed with respect to processes for forming respective ones of the interconnect structures 101, 101A, 201, 301, and 401, such interposers may be formed, but are not limited to being formed, by the processes discussed for forming the other of the interconnect structures 101, 101A, 201, 301, and 401. In some arrangements, such interposers may be formed, but are not limited to being formed, with the components electrically coupled with any of the interconnect structures 101, 101A, 201, 301, and 401 that have been discussed herein with respect to the other of the interposers 100, 100A, 200, 300, the microelectronic unit 299, and the assembly 499.

It is to be understood that the disclosure set forth herein includes all possible combinations of the particular features set forth above, whether specifically disclosed herein or not. For example, where a particular feature is disclosed in the context of a particular aspect, arrangement, configuration, or embodiment, or a particular claim, that feature can also be used, to the extent possible, in combination with and/or in the context of other particular aspects, arrangements, configurations, and embodiments of the invention, and in the invention generally.

Furthermore, although the invention herein has been described with reference to particular features, it is to be understood that these features are merely illustrative of the principles and applications of the present invention. It is therefore to be understood that numerous modifications, including changes in the dimensions of the various features described herein, may be made to the illustrative embodiments and that other arrangements may be devised without departing from the spirit and scope of the present invention. In this regard, the present invention encompasses numerous additional features in addition to those specific features set forth in the claims below. Moreover, the foregoing disclosure should be taken by way of illustration rather than by way of limitation as the present invention is defined by the claims set forth below.

The invention claimed is:

1. A method of making a component comprising:
   forming a mask over a first conductive portion of a conductive layer to expose a second conductive portion of the conductive layer,
   performing an electrolytic process to remove conductive material from a first region and a second region of the second conductive portion, the second region aligned with the mask relative to an electric field applied by the electrolytic process, the second region separating the first region of the second conductive portion from the first conductive portion, the electrolytic process concentrated relative to the second region such that removal occurs at a relatively higher rate in the second region than in the first region, wherein the second region of the second conductive portion is completely removed by the electrolytic process to electrically isolate the first conductive portion from the first region of the second conductive portion so as to form a plurality of conductive vias.

2. The method of making a component according to claim 1, wherein the first region of the second conductive portion forms a portion of a continuous commoning element surrounding each of individual formed conductive vias, the continuous commoning element being shorter than the formed conductive vias adjacent thereto.

3. The method of making a component according to claim 1, wherein at least one of the conductive vias has a height-to-width aspect ratio in the range between 20:1 and 40:1.

4. A method of making a component comprising:
   forming a mask over a first conductive portion of a conductive layer to expose a second conductive portion of the conductive layer,
   performing an electrolytic process to remove conductive material from a first region and a second region of the second conductive portion, the second region aligned with the mask relative to an electric field applied by the electrolytic process, the second region separating the first region of the second conductive portion from the first conductive portion, the electrolytic process concentrated relative to the second region such that removal occurs at a relatively higher rate in the second region than in the first region, wherein the second region of the second conductive portion is completely removed by the electrolytic process to electrically isolate the first conductive portion from the first region of the second conductive portion so as to form a plurality of conductive vias, the method further comprising forming an insulating layer between the first conductive portion and the first region of the second conductive portion to form at least a portion of an interposer.

5. The method of making a component according to claim 4, further comprising forming a barrier layer prior to forming the insulating layer, the barrier layer providing at least one of heat insulation and electrical conductivity.

6. The method of making a component according to claim 4, further comprising planarizing at least a portion of the insulating layer to expose top surfaces of at least some of the vias such that at least the planarized portion of the insulating layer and the to surfaces of the vias form a flat surface.

7. The method of making a component according to claim 6, further comprising forming at least a first wiring layer extending in at least one direction parallel to a major surface of the component, the wiring layer being electrically coupled with at least some of the exposed vias.

8. The method of making a component according to claim 4, wherein at least a surface of the second conductive portion is configured to serve as at least one of a mechanical support, a thermal conductor, and an electrical ground.

9. The method of making a component according to claim 4, wherein the first conductive portion is configured as at least a portion of a conductive via.

10. The method of making a component according to claim 9, wherein upon formation of the interposer, the conductive via extends from a first side of the interposer to a second side of the interposer, the second conductive portion being configured to provide at least one of a heat and electrical ground path function for components coupled to the interposer.

11. The method of making a component according to claim 1, wherein the electrolytic process comprises agitating an electrolytic bath and alternating between an electrolytic material removal process and an electrolytic plating process, the electrolytic removal process being relatively longer and at a relatively higher current density than the electrolytic plating process, wherein the electrolytic bath comprises a complexing agent, and wherein increasing the concentration of the complexing agent reduces mobility of ions in the electrolytic bath.

12. The method of making a component according to claim 11, wherein the electrolytic bath comprises a passivating agent selected to concentrate the electrolytic removal process to the region aligned with the mask relative to the electric field.

13. The method of making a component according to claim 1, wherein a contacting side of the conductive layer is supported by a support during the electrolytic process and wherein the electrolytic process occurs in an electrolytic solution, the method further comprising continuing the electrolytic process until the support is exposed to the electrolytic solution, the continuing of the electrolytic process forming complete vias.

14. The method of making a component according to claim 1, the conductive layer overlying a support structure, further comprising:

continuing to perform the electrolytic process until the support structure is exposed, the continuing of the performance of the electrolytic process forming complete conductive vias; and forming an insulating layer over at least portions of the continuous commoning element and the complete vias adjacent thereto.

15. A method of making an interposer comprising:

forming a mask over a first conductive portion of a conductive layer to expose a second conductive portion of the conductive layer, performing an electrolytic process to remove conductive material from a first region and a second region of the second conductive portion, the second region aligned with the mask relative to the electric field and separating the first region of the second conductive portion from the first conductive portion, the second region of the second conductive portion being completely removed by the electrolytic process to electrically isolate the first conductive portion from the first region of the second conductive portion, the electrolytic process including:

agitating an electrolytic bath and alternating between an electrolytic material removal process and an electrolytic plating process, the electrolytic removal process being relatively longer and at a relatively higher current density than the electrolytic plating process, maintaining a complexing agent in the electrolytic bath, the complexing agent configured to reduce mobility of ions in the electrolytic bath, and maintaining a passivating agent in the electrolytic bath, the passivating agent selected to concentrate the electrolytic removal process to the second region such that removal occurs at a relatively higher rate in the second region of the second conductive portion than in the first region of the second conductive portion;

forming an insulating material between the first conductive portion and the first region of the second conductive portion;

configuring the first conductive portion to form at least one conductive via, wherein at least a surface of the first region of the second conductive portion serves as at least one of a mechanical support, a thermal conductor, and an electrical ground.

16. The method as claimed in claim 1, further comprising forming an insulating layer between the first conductive portion and at least the continuous commoning element of the second conductive portion to form at least a portion of an interposer.

* * * * *